United States Patent
Kuribayashi et al.

(10) Patent No.: US 12,027,406 B2
(45) Date of Patent: Jul. 2, 2024

(54) METHOD FOR MANUFACTURING HOLDING DEVICE AND HOLDING DEVICE

(71) Applicant: NGK SPARK PLUG CO., LTD., Nagoya (JP)

(72) Inventors: Makoto Kuribayashi, Nagoya (JP); Masahiro Inoue, Nagoya (JP); Toshimasa Sakakibara, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 890 days.

(21) Appl. No.: 17/052,634

(22) PCT Filed: Jan. 8, 2019

(86) PCT No.: PCT/JP2019/000154
§ 371 (c)(1),
(2) Date: Nov. 3, 2020

(87) PCT Pub. No.: WO2019/230031
PCT Pub. Date: Dec. 5, 2019

(65) Prior Publication Data
US 2021/0183679 A1  Jun. 17, 2021

(30) Foreign Application Priority Data

May 28, 2018  (JP) ................................. 2018-101625

(51) Int. Cl.
*H01L 21/683* (2006.01)
*C04B 37/02* (2006.01)
*H01L 21/687* (2006.01)

(52) U.S. Cl.
CPC ........ *H01L 21/6833* (2013.01); *C04B 37/028* (2013.01); *C04B 37/025* (2013.01); *H01L 21/68757* (2013.01); *H01L 21/68785* (2013.01)

(58) Field of Classification Search
CPC ........... H01L 21/6833; H01L 21/68757; H01L 21/68785; H01L 21/68735; C04B 37/028; C04B 37/025; Y10T 279/14; Y10T 279/25
See application file for complete search history.

(56) References Cited

U.S. PATENT DOCUMENTS

| | | | |
|---|---|---|---|
| 7,401,399 B2 * | 7/2008 | Unno | H01L 21/67103 |
| | | | 219/448.11 |
| 2003/0094447 A1 | 5/2003 | Yamaguchi | |
| 2005/0210974 A1 | 9/2005 | Unno et al. | |
| 2008/0083736 A1 | 4/2008 | Steger et al. | |
| 2009/0161286 A1 | 6/2009 | Steger et al. | |

(Continued)

FOREIGN PATENT DOCUMENTS

| | | |
|---|---|---|
| JP | 8-8246 B2 | 1/1996 |
| JP | 11-162620 A | 6/1999 |

(Continued)

OTHER PUBLICATIONS

Communication issued on Sep. 22, 2023 by the China National Intellectual Property Administration in Chinese Patent Application No. 201980035647.9.

(Continued)

*Primary Examiner* — Eric A. Gates
*Assistant Examiner* — Reinaldo A Vargas-Del Rio
(74) *Attorney, Agent, or Firm* — Sughrue Mion, PLLC

(57) ABSTRACT

A holding device manufacturing method includes a step of preparing a first joined body which includes a pre-machining ceramic member having a first surface and a fifth surface located opposite the first surface and approximately parallel to the first surface, a base member, and a joining portion disposed between the first surface of the pre-machining ceramic member and a third surface of the base member and joining the pre-machining ceramic member and the base member together. The thickness of the joining portion of the first joined body in a first direction, in which the first surface and the third surface face each other via the joining portion, (Continued)

increases from one end side toward the other end side of the joining portion in a second direction perpendicular to the first direction. The method includes a step of machining the fifth surface of the pre-machining ceramic member in the first joined body.

8 Claims, 7 Drawing Sheets

(56) References Cited

U.S. PATENT DOCUMENTS

| | | | | |
|---|---|---|---|---|
| 2013/0256297 | A1* | 10/2013 | Nobori | H01L 21/67103 219/544 |
| 2013/0321974 | A1 | 12/2013 | Kuribayashi | |
| 2015/0270149 | A1 | 9/2015 | Kuribayashi | |

FOREIGN PATENT DOCUMENTS

| | | | |
|---|---|---|---|
| JP | 2004-220966 | A | 8/2004 |
| JP | 3982674 | B2 | 9/2007 |
| JP | 4662725 | B2 | 3/2011 |
| JP | 4749072 | B2 | 8/2011 |
| JP | 4944601 | B2 | 6/2012 |
| JP | 5222850 | B2 | 6/2013 |
| JP | 2013-247342 | A | 12/2013 |
| JP | 5509361 | B2 | 6/2014 |
| JP | 5823915 | B2 | 11/2015 |
| JP | 2016-1757 | A | 1/2016 |
| JP | 5891332 | B2 | 3/2016 |
| JP | 2016-92481 | A | 5/2016 |
| JP | 2016-189428 | A | 11/2016 |
| JP | 2017-168649 | A | 9/2017 |
| JP | 2017168649 | A * | 9/2017 |
| JP | 6215104 | B2 | 10/2017 |

OTHER PUBLICATIONS

International Search Report (PCT/ISA/210) dated Mar. 12, 2019 issued by the International Searching Authority in International Application No. PCT/JP2019/000154.

* cited by examiner

METHOD FOR MANUFACTURING HOLDING DEVICE AND HOLDING DEVICE

CROSS REFERENCE TO RELATED APPLICATIONS

This application is a National Stage of International Application No. PCT/JP2019/000154, filed Jan. 8, 2019, claiming priority based on Japanese Patent Application No. 2018-101625, filed May 28, 2018.

TECHNICAL FIELD

The technique disclosed in the present specification relates to a method for manufacturing a holding device.

BACKGROUND ART

An example of a known holding device is an electrostatic chuck which attracts and holds a wafer by means of electrostatic attraction force. The electrostatic chuck includes a ceramic member, a base member, a joining portion joining the ceramic member and the base member together, and a chuck electrode provided in the ceramic member. The electrostatic chuck attracts and holds a wafer on a surface (hereinafter referred to as an "attracting surface") of the ceramic member by utilizing electrostatic attraction force generated as a result of application of a voltage to the chuck electrode.

Since the accuracy of various processes (film formation, etching, etc.) performed on the wafer held on the attracting surface of the electrostatic chuck may degrade unless the temperature of the wafer is maintained at a desired temperature, the electrostatic chuck needs to have the ability to control the temperature distribution of the wafer.

Conventionally, there has been known an electrostatic chuck in which a resin for adjustment whose heat conductivity differs from that of the joining portion is embedded in a surface of the ceramic member opposite the attracting surface at a position determined in accordance with the temperature distribution of the attracting surface (see, for example, Patent Documents 1 and 2).

PRIOR ART DOCUMENTS

Patent Documents

Patent Document 1: Japanese Patent Application Laid-Open (kokai) No. 2016-1757
Patent Document 2: Japanese Patent Application Laid-Open (kokai) No. 2013-247342

SUMMARY OF THE INVENTION

Problem to be Solved by the Invention

A method for manufacturing an electrostatic chuck in which a ceramic member and a base member are joined together via a joining portion may involve a deviation of the temperature distribution of an attracting surface of the ceramic member from a desired distribution due to an unintentional production-related variation, for example, in the case where the heat conductivity and/or heat capacity of the ceramic member or the base member changes inside the member, the case where a heater electrode provided in the ceramic member has a heat generation distribution, the case where the flow rate of a coolant (for example, a fluorine-based inert liquid, water, or the like) flowing through a coolant channel of the base member becomes nonuniform, or the case where the ceramic member inclines in relation to the base member. Since each of a production line, a production apparatus, etc. has unintended characteristics, even when a resin for adjustment is embedded in the joining portion as in the above-described conventional electrostatic chuck manufacturing method, possibly, an overall deviation of the temperature distribution of the attracting surface cannot be suppressed sufficiently, although a partial deviation of the temperature distribution of the attracting surface can be suppressed.

Notably, such a problem is a common problem that occurs not only in the method for manufacturing the electrostatic chuck but also in a method for manufacturing a holding device (for example, a heating device, a vacuum chuck, or the like) which includes a ceramic member and a base member joined together.

The present specification discloses a technique capable of solving the above-described problem.

Means for Solving the Problems

The technique disclosed in the present specification can be embodied in the following modes.

(1) A holding device manufacturing method disclosed in the present specification is a method for manufacturing a holding device comprising a ceramic member having a first surface and a second surface located opposite the first surface, a base member having a third surface and a fourth surface located opposite the third surface and disposed such that the third surface is located on a side toward the first surface of the ceramic member, and a joining portion disposed between the first surface of the ceramic member and the third surface of the base member and joining the ceramic member and the base member together, the holding device holding an object on the second surface of the ceramic member. The holding device manufacturing method comprises the steps of: preparing a first joined body which includes a pre-machining ceramic member which is the ceramic member before formation of the second surface thereon and has the first surface and a fifth surface located opposite the first surface and approximately parallel to the first surface, the base member, and the joining portion disposed between the first surface of the pre-machining ceramic member and the third surface of the base member and joining the pre-machining ceramic member and the base member together, the joining portion of the first joined body increasing in thickness in a first direction in which the first surface and the third surface face each other via the joining portion, from one end side toward the other end side of the joining portion in a second direction approximately perpendicular to the first direction; and machining the fifth surface of the pre-machining ceramic member in the first joined body. In a method for manufacturing the holding device including the ceramic member and the base member joined together via the joining portion, the temperature distribution of the second surface of the ceramic member may deviate from a desired distribution due to the unintended characteristics of each of a production line, a production apparatus, etc. In contrast, in the present holding device manufacturing method, the first joined body in which the pre-machining ceramic member and the base member are joined together via the joining portion such that the first surface of the pre-machining ceramic member inclines in relation to the third surface of the base member is intentionally prepared. As a result, it is possible to prevent the overall temperature distribution of the second surface from deviating from a desired distribution due to the unintended characteristics of each of the production line, the production apparatus, etc.

(2) In the above-described holding device manufacturing method, the first joined body may be prepared by applying a joining agent to at least one of the first surface of the pre-machining ceramic member and the third surface of the base member such that its thickness in the first direction increases from the one end side toward the other end side in the second direction, disposing the first surface of the pre-machining ceramic member and the third surface of the base member to face each other via the joining agent, and curing the joining agent to form the joining portion. In the present holding device manufacturing method, the joining agent is applied to the first surface of the pre-machining ceramic member or the third surface of the base member in advance such that the thickness of the joining agent increases from one end side toward the other end side. Thus, according to the present holding device manufacturing method, the direction of inclination of the pre-machining ceramic member in relation to the base member can be adjusted to a desired direction.

(3) In the above-described holding device manufacturing method, the first joined body may be prepared by applying loads to portions of the joining portion located on the one end side and the other end side, respectively, in the second direction such that the load allied to the portion on the one end side is larger than the load allied to the portion on the other end side, wherein the application of the loads is performed at least before the curing of the joining agent, in the course of the curing of the joining agent, or after the curing of the joining agent. According to the present holding device manufacturing method, it is possible to reliably join the base member and the ceramic member together in a state in which the ceramic member is inclined in relation to the base member, while adjusting the direction of inclination of the ceramic member in relation to the base member to a desired direction.

(4) In the above-described holding device manufacturing method, the first joined body may be prepared by disposing a joining agent between the first surface of the pre-machining ceramic member and the third surface of the base member, and applying loads to portions of the joining portion located on the one end side and the other end side, respectively, in the second direction such that the load allied to the portion on the one end side is larger than the load allied to the portion on the other end side, wherein the application of the loads is performed at least before the curing of the joining agent, in the course of the curing of the joining agent, or after the curing of the joining agent. According to the present holding device manufacturing method, it is possible to reliably join the base member and the ceramic member together in a state in which the ceramic member is inclined in relation to the base member.

(5) The above-described holding device manufacturing method may comprise the steps of preparing a second joined body by joining the pre-machining ceramic member and the base member via a provisional joining portion and measuring a temperature distribution of the fifth surface) of the pre-machining ceramic member in the second joined body; and separating from each other the pre-machining ceramic member and the base member in the second joined body and joining the pre-machining ceramic member and the base member via a joining agent such that the first surface of the pre-machining ceramic member inclines, in relation to the third surface of the base member, to a direction determined on the basis of the measured temperature distribution, whereby the first joined body is prepared. According to the present holding device manufacturing method, the controllability of the temperature distribution of the second surface of the ceramic member (for example, heat equalization performance) can be improved by inclining the pre-machining ceramic member, in relation to the base member, to a direction determined on the basis of the measured temperature distribution of the second joined body formed by joining the pre-machining ceramic member and the base member together via the provisional joining portion.

(6) A holding device disclosed in the present specification comprises: a ceramic member having a first surface and a second surface located opposite the first surface; a base member having a third surface and a fourth surface located opposite the third surface and disposed such that the third surface is located on a side toward the first surface of the ceramic member; and a joining portion disposed between the first surface of the ceramic member and the third surface of the base member and joining the ceramic member and the base member together, the holding device being adapted to hold an object on the second surface of the ceramic member. The holding device comprises a conductor provided in the ceramic member and disposed on an imaginary plane; over the entirety of the joining portion, the joining portion increases in thickness in a first direction in which the first surface and the third surface face each other via the joining portion, from one end side toward the other end side of the joining portion in a second direction approximately perpendicular to the first direction; and the distance between the second surface and the imaginary plane on which the conductor is disposed decreases from the one end side toward the other end side of the conductor in the second direction. In the present holding device, since the heat conductivity of the joining portion is low, the temperature of a portion of the second surface of the ceramic member, which portion corresponds to a relatively thick portion of the joining portion, can be increased. Also, the temperature of the portion corresponding to the relatively thick portion of the joining portion can be increased more effectively, because the distance between the second surface of the ceramic member and the conductor is relatively short.

(7) In the above-described holding device, the conductor may be a heater electrode.

Notably, the technique disclosed in the present specification can be embodied in various forms. For example, the technique can be embodied as an electrostatic chuck, a heater device (e.g., a CVD heater), a vacuum chuck, other holding devices in which a ceramic member and a base member are joined together, and methods for manufacturing these devices.

MODES FOR CARRYING OUT THE INVENTION

A. Embodiment

Figure 1:
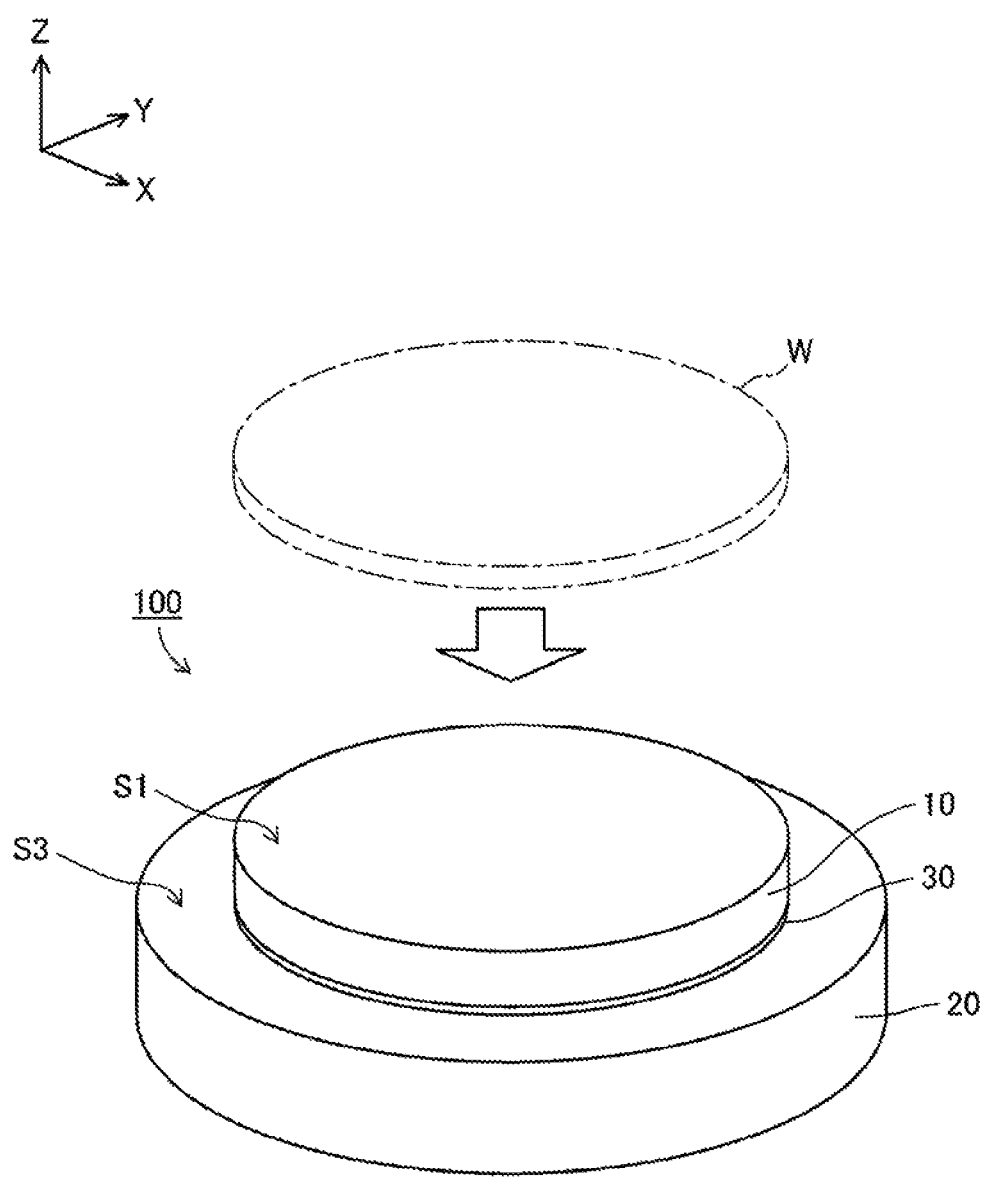
FIG. 1 is a perspective view schematically showing the external structure of an electrostatic chuck 100 in an embodiment.
Figure 2:
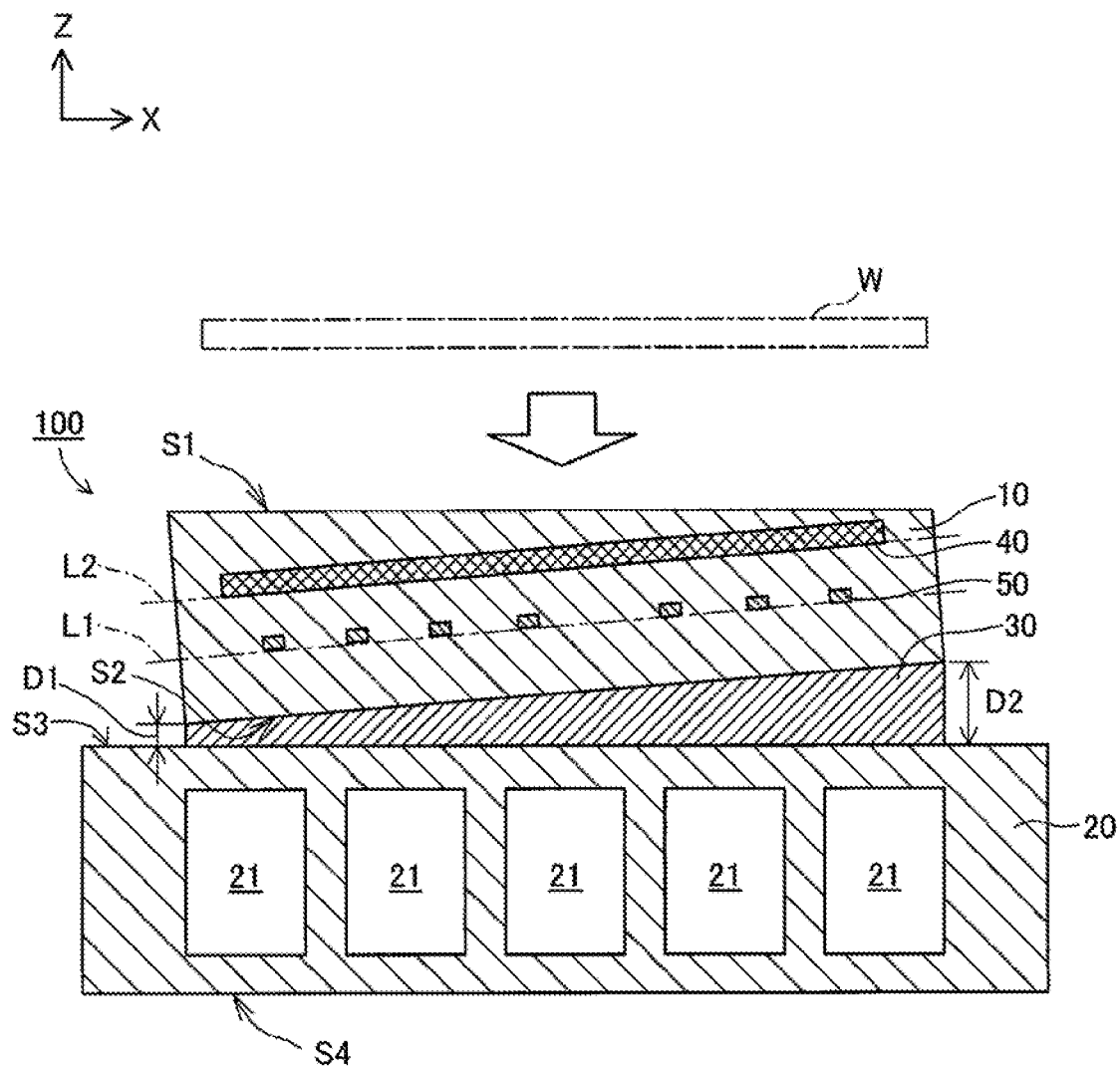
FIG. 2 is an explanatory view schematically showing the XZ cross-sectional structure of the electrostatic chuck 100 in the embodiment.

A-1. Structure of Electrostatic Chuck 100:

FIG. 1 is a perspective view schematically showing the external structure of an electrostatic chuck 100 in the present embodiment, and FIG. 2 is an explanatory view schematically showing the XZ cross-sectional structure of the electrostatic chuck 100 in the present embodiment. Mutually orthogonal X, Y, and Z axes for designating directions are shown in these figures. In the present specification, a positive Z-axis direction is referred to as an upward direction, and a negative Z-axis direction is referred to as a downward direction, for the sake of convenience. However, in actuality, the electrostatic chuck 100 may be disposed with an orientation different from such an orientation.

The electrostatic chuck 100 is a device which attracts and holds an object (e.g., a wafer W) by electrostatic attraction force and is used to fix the wafer W, for example, in a vacuum chamber of a semiconductor manufacturing apparatus. The electrostatic chuck 100 includes a ceramic member 10 and a base member 20 which are arranged in a predetermined arrangement direction (the vertical direction (the Z axis direction) in the present embodiment). The ceramic member 10 and the base member 20 are arranged such that the lower surface of the ceramic member 10 (hereinafter referred to as the "ceramic-side joining surface S2") and the upper surface of the base member 20 (hereinafter referred to as the "base-side joining surface S3") face each other in the arrangement direction and sandwich a joining portion 30, which will be described later. Namely, the base member 20 is disposed such that the base-side joining surface S3 of the base member 20 is located on the side toward the ceramic-side joining surface S2 of the ceramic member 10. The electrostatic chuck 100 further includes the joining portion 30 disposed between the ceramic-side joining surface S2 of the ceramic member 10 and the base-side joining surface S3 of the base member 20. The vertical direction (the Z-axis direction) corresponds to the first direction in the claims; the ceramic-side joining surface S2 corresponds to the first surface in the claims; and the base-side joining surface S3 corresponds to the third surface in the claims.

The ceramic member 10 is a plate-like member having, for example, a circular flat shape and is formed of a ceramic material. The diameter of the ceramic member 10 is, for example, about 50 mm to about 500 mm (generally about 200 mm to about 350 mm), and the thickness of the ceramic member 10 is, for example, about 1 mm to about 10 mm.

Various ceramic materials may be used to form the ceramic member 10. However, from the viewpoint of, for example, strength, wear resistance, and plasma resistance, it is preferred to use a ceramic material which contains aluminum oxide (alumina, $Al_2O_3$) or aluminum nitride (AlN) as a main component. Notably, the term "main component" used herein means a component whose content ratio (weight ratio) is the largest.

A pair of internal electrodes 40 formed of an electrically conductive material (for example, tungsten, molybdenum, or the like) are disposed in the ceramic member 10. When a voltage is applied from a power source (not shown) to the pair of internal electrodes 40, electrostatic attraction force is generated, and the wafer W is attracted and fixed to the upper surface (hereinafter referred to as the "attracting surface S1") of the ceramic member 10 by the electrostatic attraction force. The attracting surface S1 corresponds to the second surface in the claims.

A heater electrode 50 composed of a resistance heating element containing an electrically conductive material (for example, tungsten, molybdenum, or the like) is disposed in the ceramic member 10. When a voltage is applied from a power source (not shown) to the heater electrode 50, the heater electrode 50 generates heat. As a result, the ceramic member 10 is heated, and the wafer W held on the attracting surface S1 of the ceramic member 10 is heated. Thus, control of the temperature of the wafer W is realized. The heater electrode 50 is formed into, for example, an approximately concentric shape as viewed in the Z direction so as to heat the attracting surface S1 of the ceramic member 10 as evenly as possible.

The base member 20 is a plate-like member having, for example, a circular flat shape. The base member 20 has a diameter equal to or larger than the diameter of the ceramic member 10 and is formed of, for example, a material whose heat conductivity is higher than the heat conductivity of the ceramic material used to form the ceramic member 10 (for example, a metal (such as aluminum or an aluminum alloy)). The diameter of the base member 20 is, for example, about 220 mm to about 550 mm (generally about 220 mm to about 350 mm), and the thickness of the base member 20 is, for example, about 20 mm to about 40 mm.

A coolant channel 21 is formed in the base member 20. When a coolant (such as a fluorine-based inert liquid or water) is circulated through the coolant channel 21, the base member 20 is cooled. When the cooling of the base member 20 is performed together with the heating of the ceramic member 10 by the above-described heater electrode 50, the temperature of the wafer W held on the attracting surface S1 of the ceramic member 10 is maintained constant by virtue of heat transfer between the ceramic member 10 and the base member 20 through the bonding portion 30. Further, in the case where heat from plasma enters the electrostatic chuck 100 during a plasma process, the electric power applied to the heater electrode 50 is adjusted, whereby the temperature control of the wafer W is realized.

The bonding portion 30 contains a joining agent (adhesive) such as a silicone-based resin, an acrylic-based resin, or an epoxy-based resin and joins the ceramic member 10 and the base member 20 together. The thickness of the bonding portion 30 is, for example, 0.1 mm to 1 mm. Notably, the structure of the vicinity of a region where the ceramic member 10 and the joining portion 30 are in contact with each other, etc. will be described next.

A-2. Structure of the vicinity of a region where the ceramic member 10 and the joining portion 30 are in contact with each other, etc.:

In the present specification, for the sake of convenience, the X-axis direction will be referred to as the left-right direction, and the Y-axis direction will be referred to as the near-far direction. The left-right direction corresponds to the second direction in the claims.

As shown in FIG. 2, over the entirety of the joining portion 30, the thickness of the joining portion 30 in the vertical direction (the Z-axis direction) increases continuously from one end toward the other end of the joining portion 30 in the left-right direction (the X-axis direction). In other word, in an arbitrary cross section approximately perpendicular to the near-far direction (the Y-axis direction), the thickness of the joining portion 30 in the vertical direction increases continuously from the left end toward the right end of the joining portion 30. Notably, the difference between the thickness (D1) of the thinnest portion of the joining portion 30 and the thickness (D2) of the thickest portion of the joining portion 30 is preferably 20 μm to 100 μm, more preferably, 30 μm to 60 μm. It is not preferred that the difference in thickness in the joining portion 30 is excessively small or excessively large. Namely, when the difference in thickness in the joining portion 30 is excessively small, the sloping of the joining portion 30 may be buried in a variation in the thickness of the joining portion 30 itself in the vertical direction, and the temperature increasing effect by the joining portion 30 may not be expected. Meanwhile, when the the difference in thickness in the joining portion 30 is excessively large, the temperature of the ceramic member 10 on the outer peripheral side may increase excessively, and the strength of the joining portion 30 may decrease due to stress concentration at a specific location. Notably, in the present specification, the term "continuously" means that the joining portion 30 does not have a step. Therefore, the term "continuously" encompasses not only the case where the joining portion 30 has a straight surface (flat surface), but also the case where the joining portion 30 has, for example, a curved surface or a smooth undulation.

In the present embodiment, the base-side joining surface S3 of the base member 20 is a flat surface approximately parallel to a lower surface S4 of the base member 20. Meanwhile, the ceramic-side joining surface S2 of the ceramic member 10 is a flat surface sloping in relation to the lower surface S4 of the base member 20. Namely, the ceramic-side joining surface S2 is a sloping flat surface sloping such that the distance between the sloping flat surface and the base-side joining surface S3 increases continuously from the left end toward the right end of the joining portion 30. In other words, in an arbitrary cross section of the electrostatic chuck 100 approximately perpendicular to the near-far direction (the Y-axis direction), the ceramic-side joining surface S2 is a sloping straight line sloping such that the distance between the sloping straight line and the base-side joining surface S3 increases continuously from the left end toward the right end of the ceramic member 10. The attracting surface S1 of the ceramic member 10 is a flat surface approximately parallel to the lower surface S4 of the base member 20. Therefore, the ceramic-side joining surface S2 is a sloping flat surface sloping such that the distance between the sloping flat surface and the attracting surface S1 decreases continuously from the left end toward the right end of the ceramic member 10. The lower surface S4 of the base member 20 corresponds to the fourth surface in the claims.

In the present embodiment, the heater electrode 50 is disposed on a first imaginary plane L1 approximately parallel to the ceramic-side joining surface S2. Therefore, the distance between the attracting surface S1 and the first imaginary plane L1 on which the heater electrode 50 is disposed decreases continuously from the left end side toward the right end side of the heater electrode 50. Notably, in the present embodiment, the internal electrodes 40 are disposed on a second imaginary plane L2 approximately parallel to the ceramic-side joining surface S2.

Figure 3:
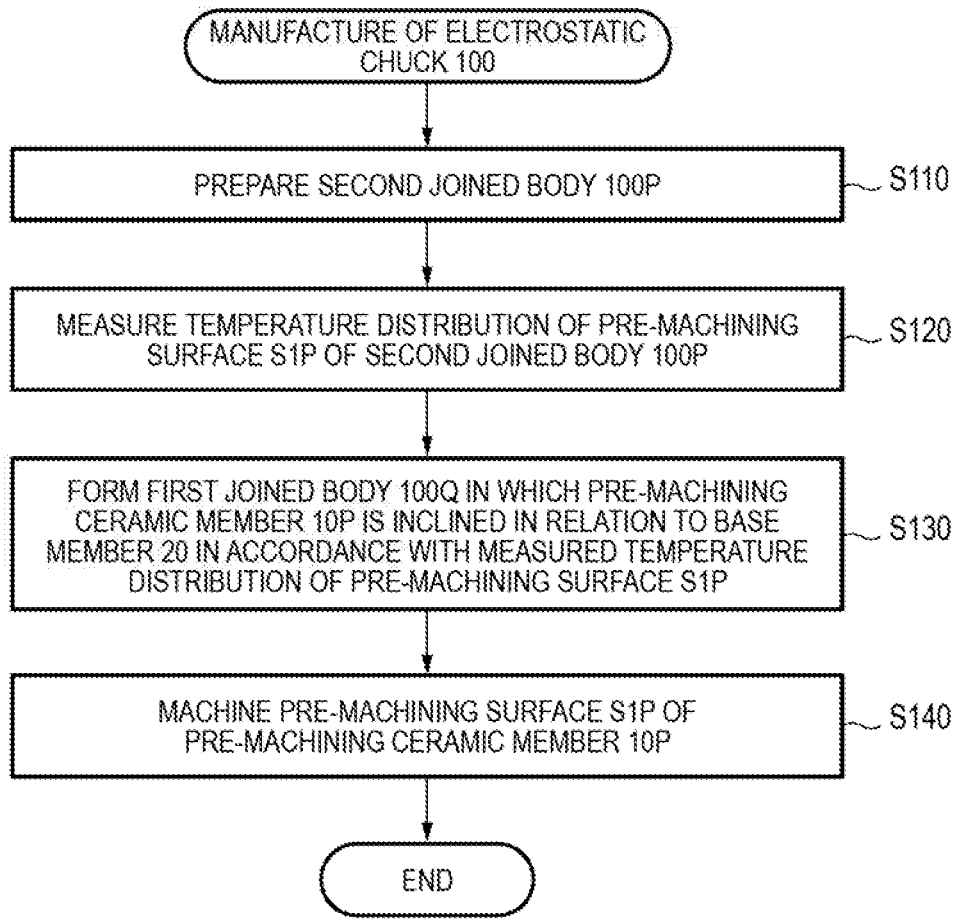
FIG. 3 is a flowchart showing a method for manufacturing the electrostatic chuck 100 in the embodiment.
Figure 4:
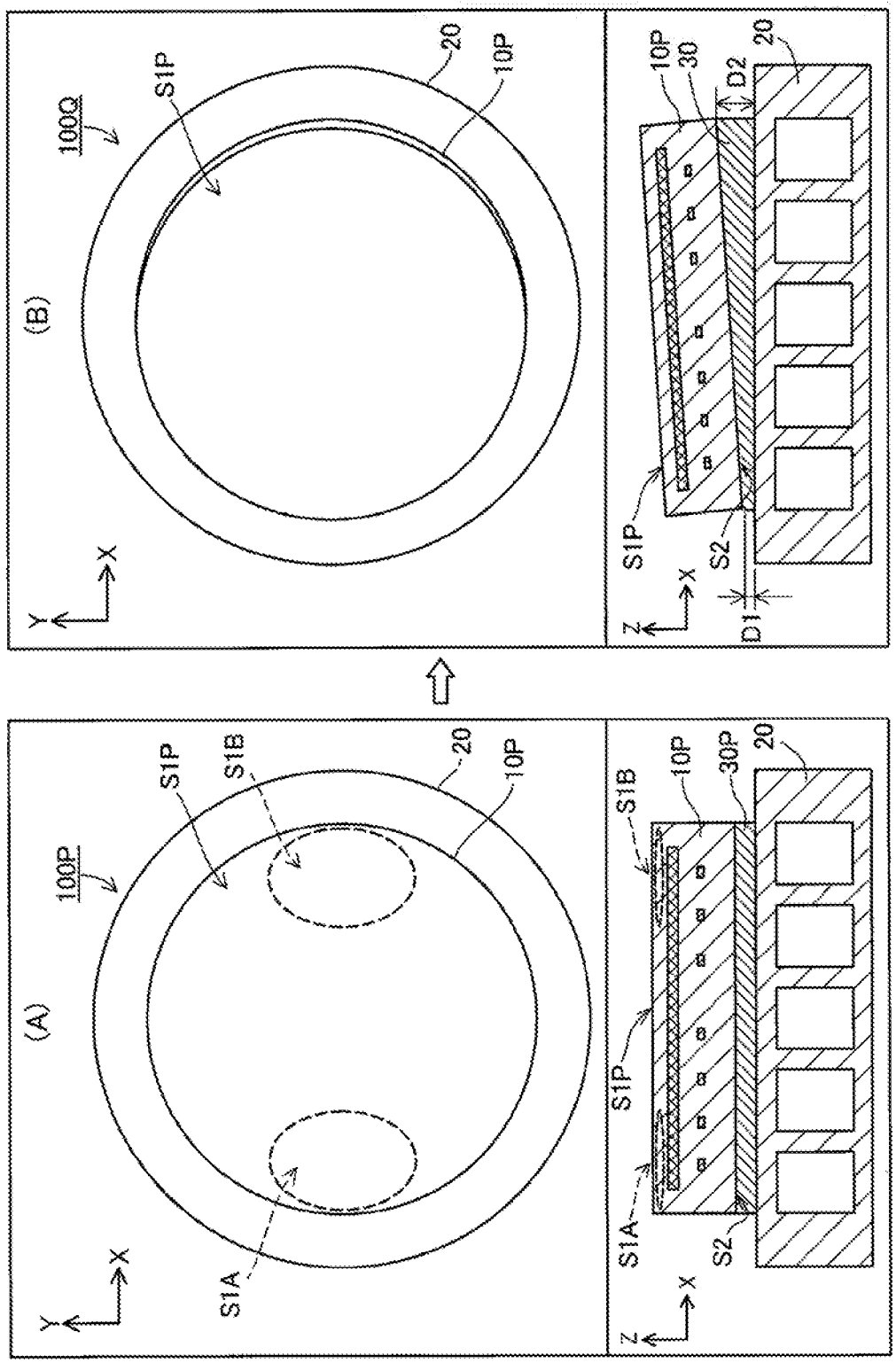
FIG. 4 is a pair of explanatory views showing the temperature distribution and XZ cross-sectional structure of a second joined body 100P and the temperature distribution and XZ cross-sectional structure of a first joined body 100Q.

A-3. Method for Manufacturing the Electrostatic Chuck 100:

FIG. 3 is a flowchart showing a method for manufacturing the electrostatic chuck 100 in the present embodiment. FIG. 4 is a pair of explanatory views showing the temperature distribution and XZ cross-sectional structure of a second joined body 100P, which will be described later, and the temperature distribution and XZ cross-sectional structure of a first joined body 100Q, which will be described later. The XY planar structure of the second joined body 100P is shown in an upper section of FIG. 4(A), and the XZ cross-sectional structure of the second joined body 100P is shown in a lower section of FIG. 4(A). The XY planar structure of the first joined body 100Q is shown in an upper section of FIG. 4(B), and the XZ cross-sectional structure of the first joined body 100Q is shown in a lower section of FIG. 4(B).

(Step of Preparing the Second Joined Body 100P):

First, the second joined body 100P is prepared (S110). As shown in FIG. 4(A), the second joined body 100P is a composite formed by joining a pre-machining ceramic member 10P and the base member 20 via a provisional joining portion 30P. The pre-machining ceramic member 10P is the above-described ceramic member 10 before being subjected to machining. Specifically, the pre-machining ceramic member 10P is the same as the ceramic member 10 except the point that a pre-machining surface S1P which will become the attracting surface S1 after the machining is approximately parallel to the ceramic-side joining surface S2. The pre-machining ceramic member 10P and the base member 20 can be manufactured by known manufacturing methods. For example, the pre-machining ceramic member 10P is manufactured by the following method. Namely, a plurality of ceramic green sheets (for example, alumna green sheets) are prepared, and processes, such as printing with metallization ink for forming the internal electrodes 40, the heater electrode 50, etc., are performed on the ceramic green sheets. Subsequently, the ceramic green sheets are stacked and are bonded together through thermocompression bonding. The resultant ceramic green laminate is cut into pieces having a predetermined disk-like shape, which are then fired, and polishing or the like is finally performed on the fired pieces, whereby the pre-machining ceramic member 10P is manufactured. Notably, the pre-machining surface SiP corresponds to the fifth surface in the claims.

(Step of Temperature Distribution Measurement):

Next, for the pre-machining surface SiP of the pre-machining ceramic member 10P in the second joined body 100P, the temperature distribution in a planar direction approximately perpendicular the vertical direction (the Z-axis direction) is measured (S120). At that time, it is preferred to measure the temperature distribution of the pre-machining surface SiP in a state in which the second joined body 100P is used. The temperature distribution of the pre-machining surface SiP is measured, for example, in a state in which electric power is supplied to the internal electrodes 40 and the heater electrode 50 provided in the pre-machining ceramic member 10P and a coolant is supplied to the coolant channel 21 formed in the base member 20. The measurement of the temperature distribution can be performed through use of, for example, an infrared radiation thermometer or a wafer with a thermocouple.

As shown in the upper section of FIG. 4(A), the results of the temperature distribution measurement in S120 show that, on the pre-machining surface SiP of the second joined body 100P, a temperature singular point S1A (temperature singular region) of high temperature is present on the left end side of the pre-machining ceramic member 10P, and a temperature singular point S1B of low temperature is present on the right end side of the pre-machining ceramic member 10P. The temperature singular points S1A and S1B may appear due to, for example, the characteristics of a production line, a production apparatus, etc. for the electrostatic chuck 100.

(Step of Forming the First Joined Body 100Q):

Next, the pre-machining ceramic member 10P and the base member 20 in the second joined body 100P are separated from each other, and then the first joined body 100Q is formed (S130). The first joined body 100Q is obtained by again joining the pre-machining ceramic member 10P and the base member 20 together and is the same as the second joined body 100P except the point that the pre-machining ceramic member 10P is disposed to incline in relation to the base member 20. Namely, the first joined body 100Q is a composite formed by joining the pre-machining ceramic member 10P and the base member 20 via the joining portion 30 such that the ceramic-side joining surface S2 of the pre-machining ceramic member 10P inclines in relation to the base-side joining surface S3 of the base member 20.

In the step of S130, after the pre-machining ceramic member 10P and the base member 20 in the second joined body 100P are separated from each other, the pre-machining ceramic member 10P and the base member 20 are joined together via a joining agent such that the ceramic-side joining surface S2 of the pre-machining ceramic member 10P inclines, in relation to the base-side joining surface S3 of the base member 20, to a direction determined on the basis of the temperature distribution of the pre-machining surface S1P measured in S120, whereby the first joined body 100Q is formed (S130). The direction determined on the basis of the temperature distribution of the pre-machining surface S1P measured in S120 refers to, for example, the direction to which the ceramic-side joining surface S2 inclines such that the pre-machining surface S1P has a desired temperature distribution (for example, the temperature becomes approximately uniform in the planar direction). In the example of FIG. 4, as shown in FIG. 4(B), the pre-machining ceramic member 10P is joined to the base member 20 while being inclined to a direction such that the distance between the ceramic-side joining surface S2 and the base-side joining surface S3 increases from the left end toward the right end of the pre-machining ceramic member 10P. As a result, the thickness (in the vertical direction (the Z-axis direction)) of the joining portion 30 in the first joined body 100Q increases continuously from the left end toward the right end of the joining portion 30, over the entirety of the joining portion 30. Therefore, at the left end side of the pre-machining ceramic member 10P, since a part of the joining portion 30, which part is present between the pre-machining ceramic member 10P and the base member 20, has a relatively small thickness, the amount of heat transfer from the pre-machining ceramic member 10P to the base member 20 is relatively large. Meanwhile, at the right end side of the pre-machining ceramic member 10P, since a part of the joining portion 30, which part is present between the pre-machining ceramic member 10P and the base member 20, has a relatively large thickness, the amount of heat transfer from the pre-machining ceramic member 10P to the base member 20 is relatively small. Therefore, in the first joined body 100Q, the temperature difference in the pre-machining surface S1P is reduced, whereby occurrence of the temperature singular point S1A and the temperature singular point S1B are suppressed.

Figure 5:
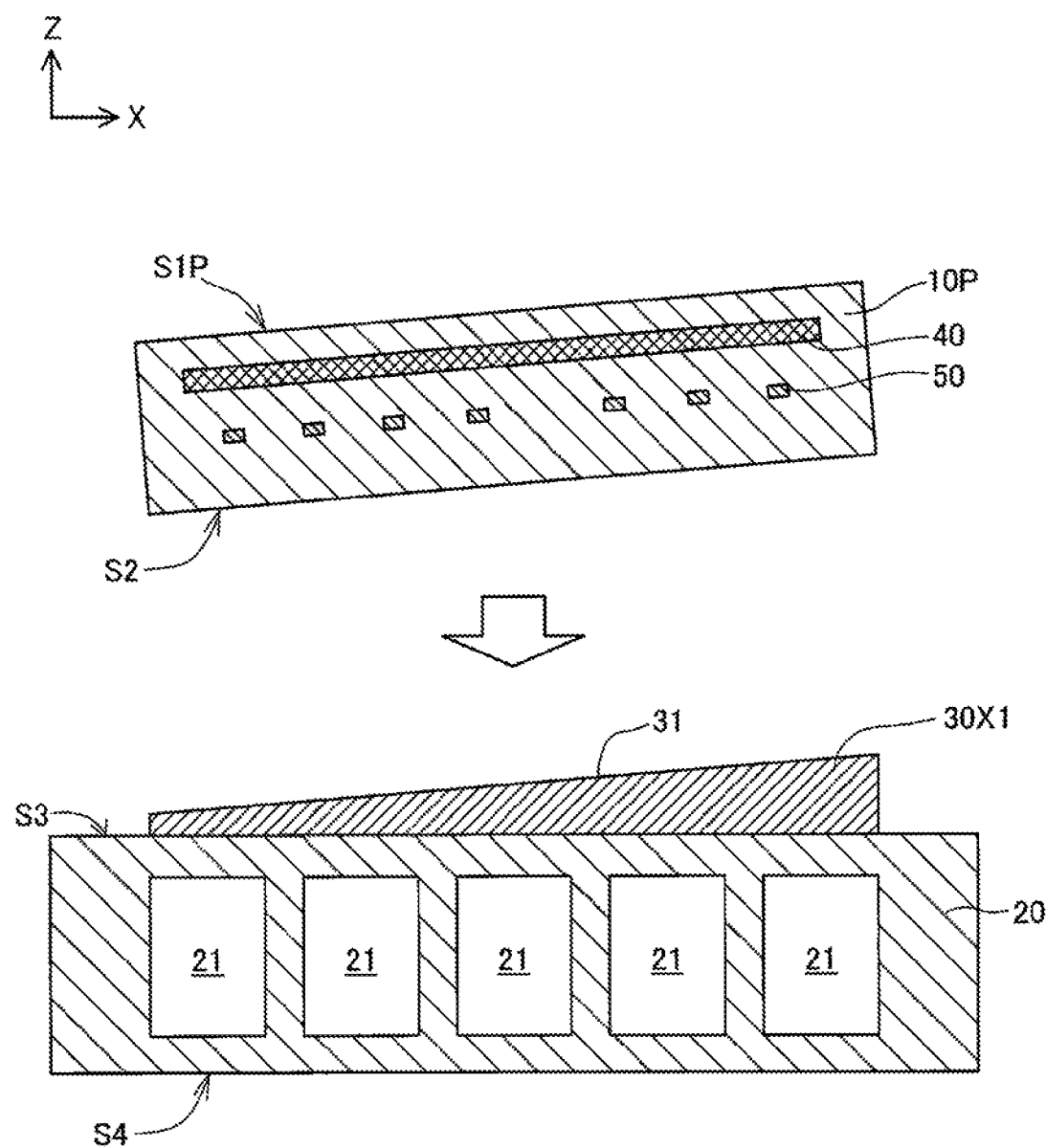
FIG. 5 is an explanatory view schematically showing a step of forming the first joined body 100Q (first forming method) in the method for manufacturing the electrostatic chuck 100.
Figure 6:
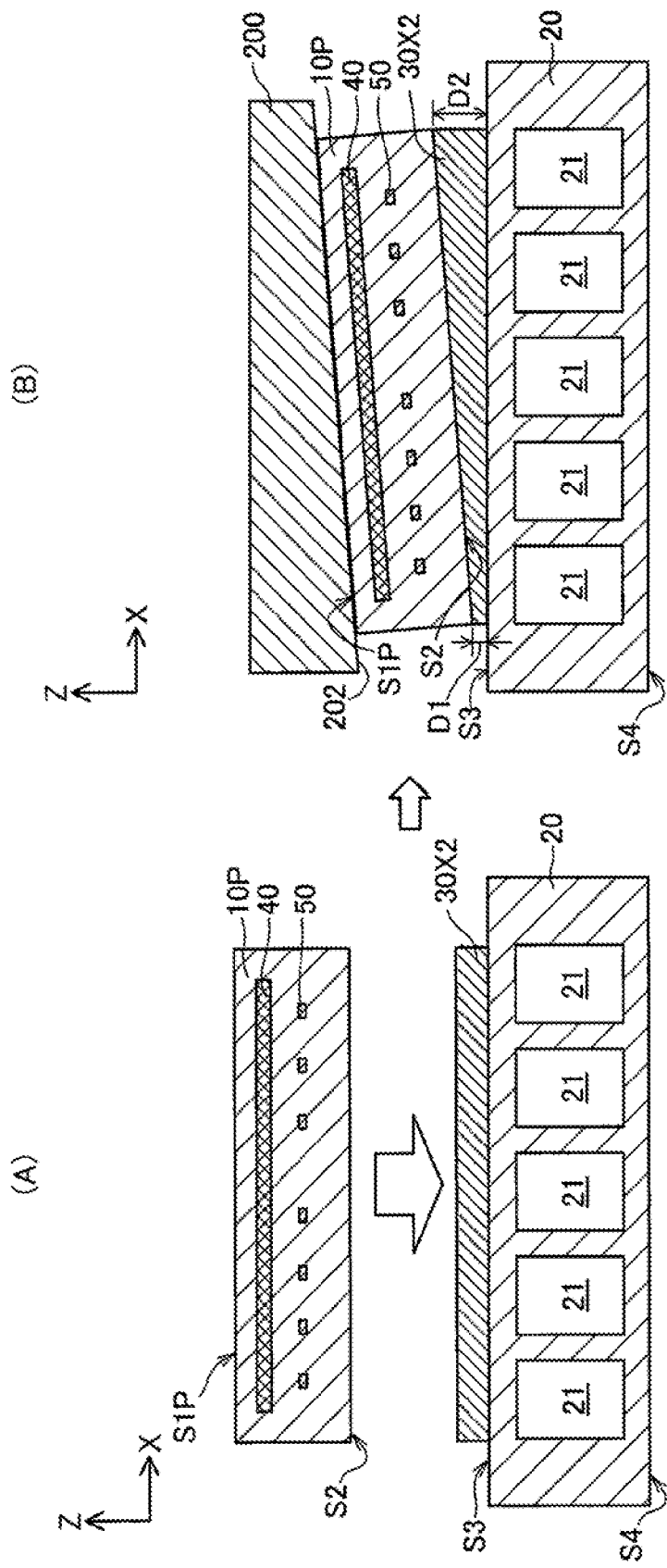
FIG. 6 is an explanatory view schematically showing a step of forming the first joined body 100Q (second forming method) in the method for manufacturing the electrostatic chuck 100.

Here, a first forming method and a second forming method for forming the first joined body 100Q will be described as examples. FIG. 5 is an explanatory view schematically showing a step of forming the first joined body 100Q (first forming method) in the method for manufacturing the electrostatic chuck 100. FIG. 6 is an explanatory view schematically showing a step of forming the first joined body 100Q (second forming method) in the method for manufacturing the electrostatic chuck 100.

(1) First Forming Method:

In the first forming method, a joining agent 30X1 is applied to at least one of the ceramic-side joining surface S2 of the pre-machining ceramic member 10P and the base-side joining surface S3 of the base member 20 in such a manner that the joining agent 30X1 has a sloping shape; i.e., a sloping upper portion 31, and the first joined body 100Q is formed by joining the pre-machining ceramic member 10P and the base member 20 by utilizing the joining agent 30X1 having a sloping shape. Specifically, as shown in FIG. 5, the joining agent 30X1 is applied to the base-side joining surface S3 of the base member 20 in such a manner that the thickness of the joining agent 30X1 in the vertical direction (the Z-axis direction) increases continuously or stepwise from the left end side toward the right end side of the base member 20. Namely, the joining agent 30X1 has a sloping surface such that, as viewed in the near-far direction (the Y-axis direction), the upper portion 31 slopes in relation to the base-side joining surface S3 of the base member 20. The joining agent 30X1 is, for example, in the form of paste and has a viscosity which allows the joining agent 30X1 to maintain the shape after being applied.

Subsequently, the ceramic-side joining surface S2 of the pre-machining ceramic member 10P and the base-side joining surface S3 of the base member 20 are bonded together via the joining agent 30X1. At that time, since the ceramic-side joining surface S2 of the pre-machining ceramic member 10P comes into contact with the sloping upper portion 31 of the joining agent 30X1, the pre-machining ceramic member 10P is disposed to incline to a predetermined direction in relation to the base member 20. A curing process for curing the joining agent 30X1 is performed in a state in which the pre-machining ceramic member 10P and the base member 20 are bonded together, whereby the above-described joining portion 30 is formed, and the first joined body 100Q is formed.

As described above, in the first forming method, the ceramic-side joining surface S2 of the pre-machining ceramic member 10P is guided by the upper portion 31 of the joining agent 30X1 applied to the base-side joining surface S3 of the base member 20, and, as a result, the pre-machining ceramic member 10P and the base member 20 are bonded together such that the ceramic-side joining surface S2 inclines to the predetermined direction in relation to the base-side joining surface S3. Thus, according to the first forming method, the direction of inclination of the premachining ceramic member 10P in relation to the base member 20 can be adjusted to a desired direction, unlike the case where the joining agent is applied to the base-side joining surface S3 of the base member 20 such that the thickness of the joining agent becomes uniform.

(2) Second Forming Method:

In the second forming method, the first joined body 100Q is formed by bonding the pre-machining ceramic member 10P and the base member 20 together via a joining agent 30X2 and applying different loads to at least one of the pre-machining ceramic member 10P and the base member 20. Specifically, as shown in FIG. 6(A), the joining agent 30X2 is applied to at least one of the ceramic-side joining surface S2 of the pre-machining ceramic member 10P and the base-side joining surface S3 of the base member 20. For example, the thickness of the joining agent 30X2 in the vertical direction (the Z-axis direction) is approximately uniform over the entire joining agent 30X2.

Next, the ceramic-side joining surface S2 of the pre-machining ceramic member 10P and the base-side joining surface S3 of the base member 20 are bonded together via the joining agent 30X2 (see FIG. 6(A)). Subsequently, an external force is applied to at least one of the pre-machining ceramic member 10P and the base member 20 such that the load in vertical direction (the Z-axis direction) applied to a left end side of the joining agent 30X2 becomes larger than the load in vertical direction (the Z-axis direction) applied to a right end side of the joining agent 30X2. For example, as shown in FIG. 6(B), a jig 200 having a sloping lower surface 202 is prepared, and the lower surface 202 of the jig 200 is pressed against the pre-machining surface S1P of the pre-machining ceramic member 10P of the second joined body 100P. As a result, a left-hand-side portion of the joining agent 30X2 is squeezed more greatly as compared with a right-hand-side portion of the joining agent 30X2, so that the pre-machining ceramic member 10P is disposed to incline in relation to the base member 20. A curing process for curing the joining agent 30X2 is performed in a state in which the pre-machining ceramic member 10P and the base member 20 are bonded together, whereby the above-described joining portion 30 is formed, and the first joined body 100Q is formed.

(Step of Machining the Pre-Machining Surface S1P of the Pre-Machining Ceramic Member 10P):

After formation of the first joined body 100Q, the pre-machining surface S1P of the pre-machining ceramic member 10P in the first joined body 100Q is machined (S140). In the present embodiment, the pre-machining surface S1P is machined to decrease the inclination angle of the pre-machining surface S1P in relation to the lower surface S4 of the base member 20. As a result, the pre-machining surface S1P becomes the attracting surface S1 approximately parallel to the lower surface S4 of the base member 20. Notably, the machining of the pre-machining surface S1P can be performed relatively simply by, for example, polishing or blasting. After completion of the machining of the pre-machining surface S1P, a surface treatment is performed, for example, a plurality of protrusions are formed on the pre-machining surface S1P, or a seal band is formed on the pre-machining surface S1P. As a result of performance of the above-described steps, manufacture of the electrostatic chuck 100 having the above-described structure is completed. Notably, even when the inclination angle of the pre-machining surface S1P is changed or protrusions are formed, the influence on the temperature distribution of the attracting surface S1 of the electrostatic chuck 100 is relatively small. The reason for this is as follows. The heat conductivity of the ceramic material used to form the ceramic member 10 is higher than the heat conductivity of the material used to form the joining portion 30. Therefore, even when the variation of the distance between the attracting surface S1 and the heater electrode 50 changes due to machining of the pre-machining surface S1P, its influence on the temperature distribution is small as compared with the variation of the thickness of the joining portion 30.

A-4. Effects of the Present Embodiment:

As described above, in the method for manufacturing electrostatic chuck 100 of the present embodiment, the first joined body 100Q in which the pre-machining ceramic member 10P and the base member 20 are joined together via the joining portion 30 such that the ceramic-side joining surface S2 of the pre-machining ceramic member 10P inclines in relation to the base-side joining surface S3 of the base member 20 is intentionally prepared. As a result, it is possible to prevent the overall temperature distribution of the attracting surface S1 from deviating from a desired distribution due to the unintended characteristics of a production line, a production apparatus, etc. Also, the temperature distribution of the attracting surface S1 can be controlled by a relatively simple method of changing the inclination angle of the ceramic member 10 in relation to the base member 20.

B. Modifications

The technique disclosed in the present specification is not limited to the embodiment described above and may be modified into various forms without departing from the scope of the invention. For example, the following modifications are possible.

The structure of the electrostatic chuck 100 in the above-described embodiment is a merely example and can be modified variously. For example, the electrostatic chuck 100 may be configured such that at least one of the heater electrode 50 and the internal electrodes 40 is not provided in the ceramic member 10. This is because the controllability of the temperature distribution of the attracting surface S1 may be required in such a configuration. Also, the electrostatic chucks 100 may have, for example, a structure in which a metal, a ceramic material, a resin, or the like is disposed between the ceramic member 10 and the base member 20 or a structure in which, separately from the heater electrode 50 disposed in the ceramic member 10, a heater is disposed between the ceramic member 10 and the base member 20. In the above-described embodiment, the heater electrode 50 is exemplified as a conductor. However, the conductor is not limited thereto, and any of other conductors, such as a resistor for temperature measurement, may be disposed in the ceramic member 10.

In the above-described embodiment, the ceramic-side joining surface S2 is not limited to a flat surface and may be, for example, a sloping curved surface sloping such that the distance between the ceramic-side joining surface S2 and the base-side joining surface S3 increases from the left end toward the right end of the joining portion 30. In other words, in an arbitrary cross section of the electrostatic chuck 100 approximately perpendicular to the near-far direction (the Y-axis direction), the ceramic-side joining surface S2 may be a sloping curved line sloping such that the distance between the sloping curved line and the base-side joining surface S3 increases from the left end toward the right end of the ceramic member 10.

The method for manufacturing the electrostatic chuck 100 in the above-described embodiment is a mere example and may be modified in various ways. For example, in the first forming method of the step of forming the first joined body 100Q (S130 of FIG. 3) in the above-described embodiment, a joining agent may be applied to the ceramic-side joining surface S2 of the pre-machining ceramic member 10P or to both the ceramic-side joining surface S2 and the base-side joining surface S3 of the base member 20 in such a manner that the thickness of the joining agent in the vertical direction (the Z-axis direction) increases from the left end side toward the right end side of the pre-machining ceramic member 10P or the base member 20.

Figure 7:
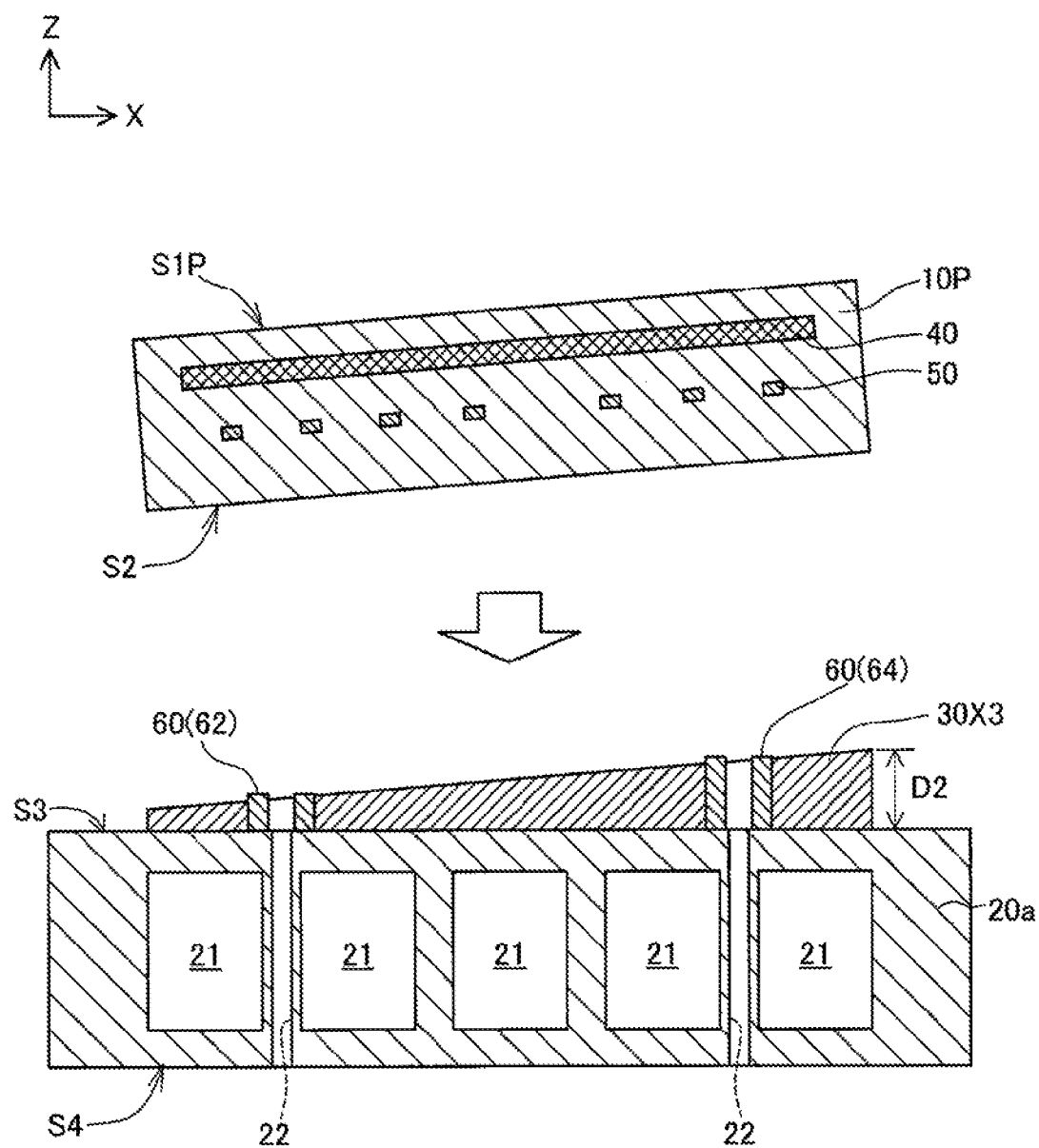
FIG. 7 is an explanatory view schematically showing the step of a modification of the first forming method.

FIG. 7 is an explanatory view schematically showing the step of a modification of the first forming method. In FIG. 7, constituent elements identical to those of FIG. 5 are denoted by the same reference numerals, and only constituent elements different from those of FIG. 5 are denoted by different reference numerals. The base member 20a shown in FIG. 7 is the same as the base member 20 of the above-described embodiment except the point that the base member 20a has a plurality of through holes 22 extending through the base member 20a in the vertical direction. The through holes 22 communicate with, for example, a gas passage and a lift pin insertion hole (both of which are not shown in the drawing) formed in the pre-machining ceramic member 10P in a state in which the pre-machining ceramic member 10P and the base member 20a are joined together. In the case where holes (e.g., the through holes 22) open to the base-side joining surface S3 are formed in the base-side joining surface S3 of the base member 20a, it is preferred to dispose annular dam portions 60 on the base-side joining surface S3 such that the dam portions 60 surround the openings of the respective through holes 22 as viewed in the vertical direction (the Z-axis direction). The dam portions 60 are formed of, for example, the same material as the joining agent 30X3 and has been subjected to a curing process beforehand before the joining agent 30X3 is applied to the base-side joining surface S3. As a result, it is possible to prevent the joining agent 30X3 from entering the through holes 22 and causing clogging or the like when the pre-machining ceramic member 10P and the base member 20a are joined together. In the present modification, the plurality of dam portions 60 include a first dam portion 62 and a second dam portion 64 whose lengths in the vertical direction differ from each other. Specifically, the length (in the vertical direction) of the first dam portion 62 located on the left side is shorter than the length (in the vertical direction) of the second dam portion 64 located on the right side. As a result, as shown in FIG. 7, when the pre-machining ceramic member 10P and the base member 20a are joined together, the pre-machining ceramic member 10P can be precisely inclined to a predetermined direction in relation to the base member 20a by the first dam portion 62 and the second dam portion 64, which are harder than the joining agent 30X3. Notably, when a curing process is performed on the joining agent 30X3, the joining agent 30X3 and the dam portions 60 are integrated, whereby the joining portion 30 is formed.

In the second forming method of the step of forming the first joined body 100Q (S130 of FIG. 3) of the above-described embodiment, loads different from each other may be applied to the right end side and left end side portions of the second joined body 100P without using the jig 200. In an example load application method, a weight may be placed on the second joined body 100P so as to apply a load to the joining agent 30X2. In another example load application method, a vice (C clamp or the like) is used to sandwich the second joined body 100P and the base member 20 to thereby apply a load to the joining agent 30X2. In the second forming method, the joining agent 30X2 applied to, for example, the base-side joining surface S3 of the base member 20 may have a sloping shape similar to that of the joining agent 30X1 used in the first forming method. When the joining agent 30X2 has a sloping shape, in the second forming method, it is possible to prevent the inclination direction of the pre-machining ceramic member 10P in relation to the base member 20 from deviating from the desired direction. In the above-described embodiment, the load application timing in the second forming method is before curing of the joining agent 30X2. However, the load may be applied during the process for curing the joining agent 30X2 or after the process for curing the joining agent 30X2.

The process performed in the step of machining the pre-machining surface S1P of the pre-machining ceramic member 10P (S140 of FIG. 3) in the above-described embodiment is not limited to the machining for changing the inclination angle of the pre-machining surface S1P. For example, a plurality of protrusions may be formed on the pre-machining surface S1P, or surface treatment may be performed on the pre-machining surface S1P.

In the above-described embodiment, the pre-machining ceramic member 10P and the base member 20 are joined together (S130) in such a manner that the pre-machining ceramic member 10P inclines, in relation to the base member 20, to a direction determined on the basis of the temperature distribution of the pre-machining surface S1P measured in S120. However, the pre-machining ceramic member 10P and the base member 20 may be joined together in such a manner that the pre-machining ceramic member 10P inclines to a predetermined direction in relation to the base member 20 without measuring the temperature distribution of the pre-machining surface SiP in the second joined body 100P. This is because, in some cases, the position on the pre-machining surface SiP of the first joined body 100Q at which the temperature singular point appears can be predicted beforehand from the characteristics of the production line, the production apparatus, etc. for the electrostatic chuck 100. In such a case, it is sufficient to join the pre-machining ceramic member 10P to the base member 20 such that the pre-machining ceramic member 10P inclines to a predetermined direction determined on the characteristics of the process of the production line, the production apparatus, etc. without measuring the temperature distribution of the pre-machining surface SiP of the first joined body 100Q.

The present invention can be applied not only to the electrostatic chuck 100, which holds the wafer W by using electrostatic attraction force, but also to other holding devices (a vacuum chuck or the like) and manufacturing methods therefor.

DESCRIPTION OF REFERENCE NUMERALS

10: ceramic member 10P: pre-machining ceramic member 20, 20a: base member 21: coolant channel 22: through hole 30: joining portion 30P: provisional joining portion 30X1, 30X2, 30X3: joining agent 31: upper portion 40: internal electrode 50: heater electrode 60: dam portion 62: first dam portion 64: second dam portion 100: electrostatic chuck 100P: second joined body 100Q: first joined body 200: jig 202: lower surface L1: first imaginary plane L2: second imaginary plane S1: attracting surface S1A, S1B, S1C: temperature singular point S1P: pre-machining surface S2: ceramic-side joining surface S3: base-side joining surface S4: lower surface W: wafer

The invention claimed is:

1. A holding device comprising:
a ceramic member having a first surface and a second surface located opposite the first surface;
a base member having a third surface and a fourth surface located opposite the third surface and disposed such that the third surface is located on a side toward the first surface of the ceramic member; and
a joining portion disposed between the first surface of the ceramic member and the third surface of the base member and joining the ceramic member and the base member together,
the holding device being adapted to hold an object on the second surface of the ceramic member and being characterized in that
the holding device comprises a conductor provided in the ceramic member and disposed on an imaginary plane;
over the entirety of the joining portion, the joining portion increases in thickness in a first direction in which the first surface and the third surface face each other via the joining portion, from one end side of an arbitrary cross section of the joining portion toward the other end side of the arbitrary cross section of the joining portion in a second direction approximately perpendicular to the first direction;
the distance between the second surface and the imaginary plane on which the conductor is disposed decreases from one end side of a cross section of the conductor along the imaginary plane toward the other end side of the cross section of the conductor in the second direction; and
the joining portion extends along an entirety of the first surface of the ceramic member from one end side of the ceramic member to the other end side of the ceramic member.

2. A holding device according to claim 1, wherein the conductor is a heater electrode.

3. A holding device according to claim 1, wherein the first surface is approximately parallel to the third surface.

4. A method for manufacturing the holding device according to claim 1,
the method being characterized by comprising the steps of:
preparing a first joined body which includes a pre-machining ceramic member which is the ceramic member before formation of the second surface thereon and has the first surface and a fifth surface located opposite the first surface and approximately parallel to the first surface, the base member, and the joining portion disposed between the first surface of the pre-machining ceramic member and the third surface of the base member and joining the pre-machining ceramic member and the base member together, the joining portion of the first joined body increasing in thickness in a first direction in which the first surface and the third surface face each other via the joining portion, from one end side toward the other end side of the joining portion in a second direction approximately perpendicular to the first direction; and
machining the fifth surface of the pre-machining ceramic member in the first joined body.

5. A holding device manufacturing method according to claim 4, wherein the first joined body is prepared by applying a joining agent to at least one of the first surface of the pre-machining ceramic member and the third surface of the base member such that its thickness in the first direction increases from the one end side toward the other end side in the second direction, disposing the first surface of the pre-machining ceramic member and the third surface of the base member to face each other via the joining agent, and curing the joining agent to form the joining portion.

6. A holding device manufacturing method according to claim 5, wherein the first joined body is prepared by applying loads to portions of the joining portion located on the one end side and the other end side, respectively, in the second direction such that the load allied to the portion on the one end side is larger than the load allied to the portion on the other end side, wherein the application of the loads is performed at least before the curing of the joining agent, in the course of the curing of the joining agent, or after the curing of the joining agent.

7. A holding device manufacturing method according to claim 4, wherein the first joined body is prepared by disposing a joining agent between the first surface of the premachining ceramic member and the third surface of the base member, and applying loads to portions of the joining portion located on the one end side and the other end side, respectively, in the second direction such that the load allied to the portion on the one end side is larger than the load allied to the portion on the other end side, wherein the application of the loads is performed at least before the curing of the joining agent, in the course of the curing of the joining agent, or after the curing of the joining agent.

8. A holding device manufacturing method according to claim 4, further comprising the steps of
preparing a second joined body by joining the pre-machining ceramic member and the base member via a provisional joining portion and measuring a temperature distribution of the fifth surface of the pre-machining ceramic member in the second joined body; and
separating from each other the pre-machining ceramic member and the base member in the second joined body and joining the pre-machining ceramic member and the base member via a joining agent such that the first surface of the pre-machining ceramic member inclines, in relation to the third surface of the base member, whereby the first joined body is prepared.

* * * * *